United States Patent
Nakatani et al.

(10) Patent No.: US 10,225,967 B2
(45) Date of Patent: Mar. 5, 2019

(54) NOISE SUPPRESSION CABLE

(71) Applicant: Hitachi Metals, Ltd., Tokyo (JP)

(72) Inventors: Katsutoshi Nakatani, Hitachi (JP); Kenji Ajima, Hitachiota (JP); Yosuke Sumi, Hitachinaka (JP); Katsuya Akimoto, Hitachi (JP); Naofumi Chiwata, Mito (JP); Hiroshi Okikawa, Hitachi (JP); Yasuharu Muto, Kitaibaraki (JP)

(73) Assignee: HITACHI METALS, LTD., Tokyo (JP)

( * ) Notice: Subject to any disclaimer, the term of this patent is extended or adjusted under 35 U.S.C. 154(b) by 4 days.

(21) Appl. No.: 15/301,114

(22) PCT Filed: Mar. 25, 2015

(86) PCT No.: PCT/JP2015/059243
§ 371 (c)(1),
(2) Date: Sep. 30, 2016

(87) PCT Pub. No.: WO2015/151979
PCT Pub. Date: Oct. 8, 2015

(65) Prior Publication Data
US 2017/0020037 A1 Jan. 19, 2017

(30) Foreign Application Priority Data
Apr. 2, 2014 (JP) .................................. 2014-076247

(51) Int. Cl.
*H01B 7/02* (2006.01)
*H05K 9/00* (2006.01)
(Continued)

(52) U.S. Cl.
CPC ............ *H05K 9/0098* (2013.01); *H01B 9/021* (2013.01); *H01B 9/022* (2013.01); *H01B 11/1895* (2013.01); *H05K 9/0075* (2013.01)

(58) Field of Classification Search
USPC ....... 174/102 R, 103, 105 SC, 107, 108, 109, 174/110 R, 111, 112, 113 R, 118, 120 R,
(Continued)

(56) References Cited

U.S. PATENT DOCUMENTS 1,756,319 A * 4/1930 Wentz .................. H01B 13/282
174/128.1
1,925,611 A * 9/1933 Garnett .................. H01B 11/14
156/53

(Continued)

FOREIGN PATENT DOCUMENTS

GB 750692 * 6/1956 ............... H01B 7/00
JP 63-181649 A * 7/1988 ............. H02K 21/06
(Continued)

OTHER PUBLICATIONS

International Search Report (ISR) (PCT Form PCT/ISA/210), in PCT/JP2015/059243, dated Jun. 16, 2015.
(Continued)

*Primary Examiner* — William H Mayo, III
(74) *Attorney, Agent, or Firm* — McGinn I.P. Law Group, PLLC.

(57) ABSTRACT

A noise suppression cable includes an insulated electric wire including an insulator that covers an outer periphery of a conductor wire, and a magnetic tape layer formed by transversely winding a magnetic tape on an outer periphery of the insulated electric wire. A magnetic body constituting the magnetic tape is cut out from a rolled material in such a manner that a width direction of the magnetic tape corresponds to a rolled direction, and the magnetic body has a
(Continued)

magnetic property that is different between the width direction and an orthogonal direction to the width direction.

20 Claims, 10 Drawing Sheets

(51) Int. Cl.
 *H01B 9/02* (2006.01)
 *H01B 11/18* (2006.01)
(58) Field of Classification Search
 USPC .................................... 174/120 SC, 121 R
 See application file for complete search history.

(56) References Cited

U.S. PATENT DOCUMENTS

| | | | | |
|---|---|---|---|---|
| 3,219,951 | A * | 11/1965 | Clark | H01B 11/143 174/36 |
| 4,816,614 | A * | 3/1989 | Baigrie | H01B 11/146 174/102 A |
| 4,843,356 | A * | 6/1989 | Lusignan | H01B 11/146 174/105 R |
| 5,023,395 | A * | 6/1991 | O'Connor | B32B 15/08 174/36 |
| 5,053,582 | A * | 10/1991 | Terakawa | H01B 11/1008 156/53 |
| 5,990,417 | A * | 11/1999 | Senda | H01F 17/06 174/391 |
| 6,234,708 | B1 * | 5/2001 | Beck | A63K 3/046 119/705 |
| 7,342,172 | B1 * | 3/2008 | Wang | H01B 11/1083 174/36 |
| 9,725,622 | B2 * | 8/2017 | Korthals | C09J 7/0207 |
| 2003/0031897 | A1 * | 2/2003 | Fukazawa | B82Y 10/00 428/833 |
| 2003/0068945 | A1 * | 4/2003 | Samson-Himmelstjerna | C09J 7/21 442/149 |
| 2004/0055772 | A1 * | 3/2004 | Tsutsui | H01B 11/1016 174/36 |
| 2006/0231192 | A1 * | 10/2006 | Wahlers-Schmidlin | H02G 3/0481 156/184 |

FOREIGN PATENT DOCUMENTS

| | | | | |
|---|---|---|---|---|
| JP | S63-181649 | A | | 7/1988 |
| JP | 2000-030943 | A * | 1/2000 | ............ H01B 7/00 |
| JP | 2002-025356 | A | | 1/2002 |
| JP | 2002-198239 | A | | 7/2002 |
| JP | 2004-158328 | A * | 6/2004 | ............ H01B 11/06 |

OTHER PUBLICATIONS

English Translation of the International Preliminary Report on Patentability (PCT/IB/373) in PCT Application No. PCT/JP2015/059243 dated Oct. 13, 2016.
Notification of Transmittal of Translation of the International Preliminary Report on Patentability (PCT/IB/338) dated Oct. 13, 2016.
Written Opinion of the International Searching Authority (PCT/ISA/237).
Chinese Office Action dated May 2, 2017 with an English translation thereof.
Japanese Office Action dated Apr. 18, 2017 in Japanese Application No. 2014-076247 with an English translation thereof.

* cited by examiner

FIG.3A
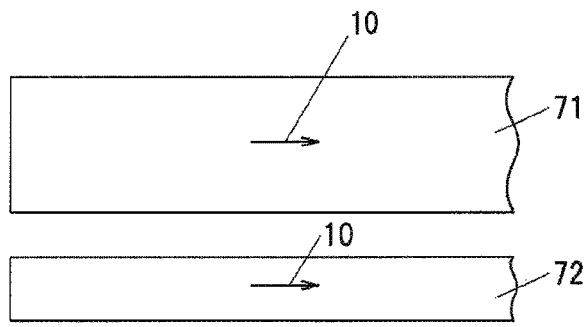
FIG.3B1
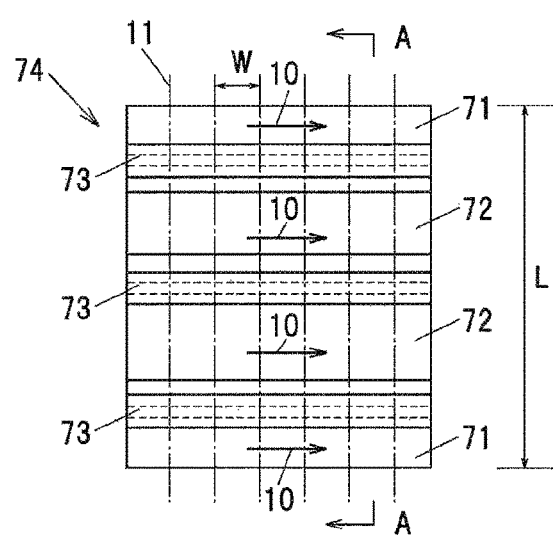
FIG.3B2
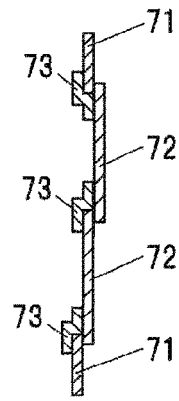
FIG.3C
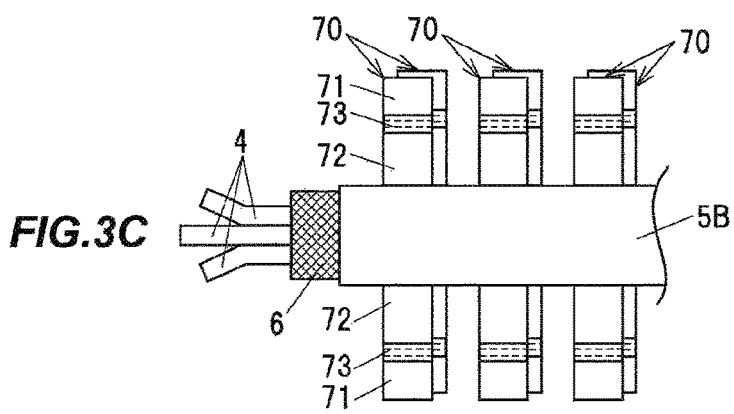
FIG.3D
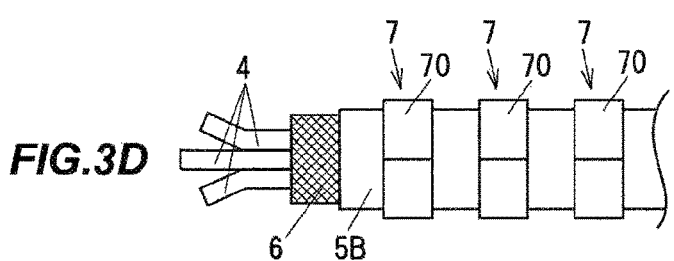

*FIG.4A*        *FIG.4B*
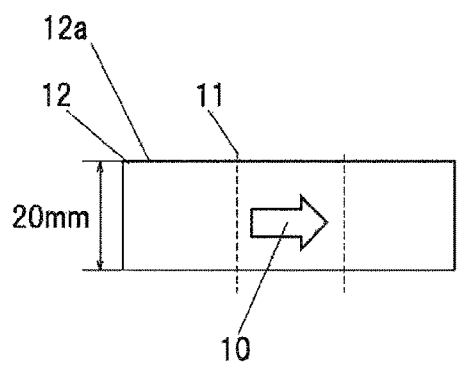
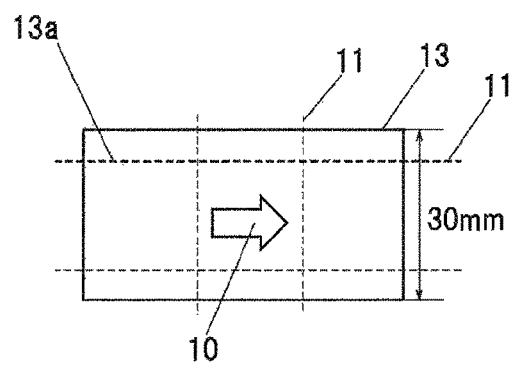

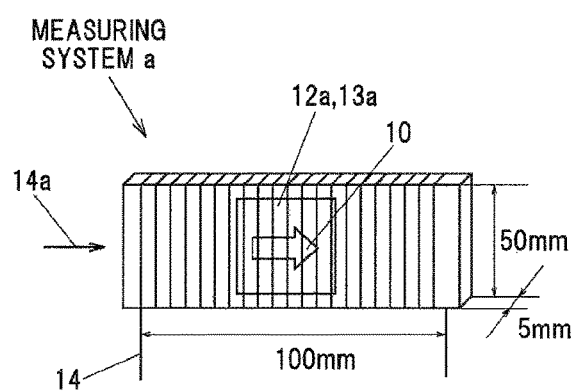
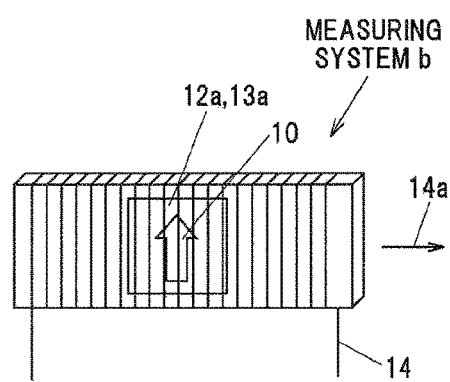
FIG.5A
FIG.5B

NOISE SUPPRESSION CABLE

TECHNICAL FIELD

The present invention relates to a noise suppression cable in which a magnetic tape is used to suppress electromagnetic wave noise.

BACKGROUND ART

A noise suppression cable, which does not have a ferrite core around the cable but has a magnetic tape wrapped around an electric wire, is known (see e.g. PTL 1).

In this noise suppression cable, magnetic metal tapes (or simply called magnetic tapes) having a predetermined width are wrapped around an insulated wire formed by covering a conductor with an insulation and are arranged at a predetermined distance along a cable longitudinal direction. In general, magnetic tapes are formed by a slitting process, i.e., by continuously cutting a long and wide rolled material to a certain width and rewinding onto a roll or reel. A noise suppression effect of the conventional noise suppression cable is controlled by adjusting a tape length and a tape width. In addition, since plural narrow magnetic tapes are arranged at appropriate intervals, flexibility of the cable is improved.

CITATION LIST

Patent Literature

[PTL 1]
JP-A-2002-25356

SUMMARY OF INVENTION

Technical Problem

In the above-mentioned noise suppression cable, the magnetic tape cut out from a rolled material may not provide a desired electromagnetic wave noise suppression effect depending on the rolled direction.

It is an object of the invention to provide a noise suppression cable that achieves an improvement in the effect of electromagnetic wave suppression.

Solution to Problem

According to one embodiment, provided is a noise suppression cable, comprising an insulated electric wire comprising an insulator that covers an outer periphery of a conductor wire and a magnetic tape layer formed by transversely winding a magnetic tape on an outer periphery of the insulated electric wire, wherein a magnetic body constituting the magnetic tape is cut out from a rolled material in such a manner that a width direction of the magnetic tape corresponds to a rolled direction, and the magnetic body has a magnetic property that is different between the width direction and an orthogonal direction to the width direction.

The magnetic body may have a magnetic permeability in the orthogonal direction to the width direction greater than that in the width direction. A plurality of magnetic tape layers may be formed at predetermined intervals along a cable longitudinal direction. The magnetic tape may comprise a single magnetic body or a plurality of magnetic bodies that are joined in the orthogonal direction to the width direction. The magnetic tape layer may be formed by transversely winding the magnetic tape multiple times.

Advantageous Effects of Invention

According to an embodiment of the invention, a noise suppression cable can be provided that achieves an improvement in the effect of electromagnetic wave suppression.

BRIEF DESCRIPTION OF DRAWINGS

FIG. 3A is a plan view showing rolled materials used in a process of forming magnetic tape layers.

FIG. 3B1 is a plan view showing a magnetic sheet used in the process of forming the magnetic tape layers.

FIG. 3B2 is a cross sectional view taken along a line A-A in FIG. 3B1.

FIG. 3C is an explanatory diagram illustrating magnetic tapes which are formed by cutting the magnetic sheet shown in FIG. 3B1 to a predetermined width and are arranged on the outer side of a shield layer.

FIG. 3D is an explanatory diagram illustrating magnetic tape layers formed by transversely wrapping the magnetic tapes on the outer side of the shield layer.

FIG. 4A is an explanatory diagram illustrating a method of making a test piece-A which is used to test for induced magnetic anisotropy of a rolled material.

FIG. 4B is an explanatory diagram illustrating a method of making a test piece-B which is used to test for induced magnetic anisotropy of a rolled material.

FIG. 5A is an explanatory diagram illustrating a system for measuring inductance of a coil in which the test pieces-A and -B are placed so that the rolled direction of the pieces-A and -B coincides with a magnetic field direction of the coil.

FIG. 5B is an explanatory diagram illustrating a system for measuring inductance of a coil in which the test pieces-A and -B are placed so that the rolled direction of the pieces-A and -B is orthogonal to the magnetic field direction of the coil.

DESCRIPTION OF EMBODIMENT

Figure 1:
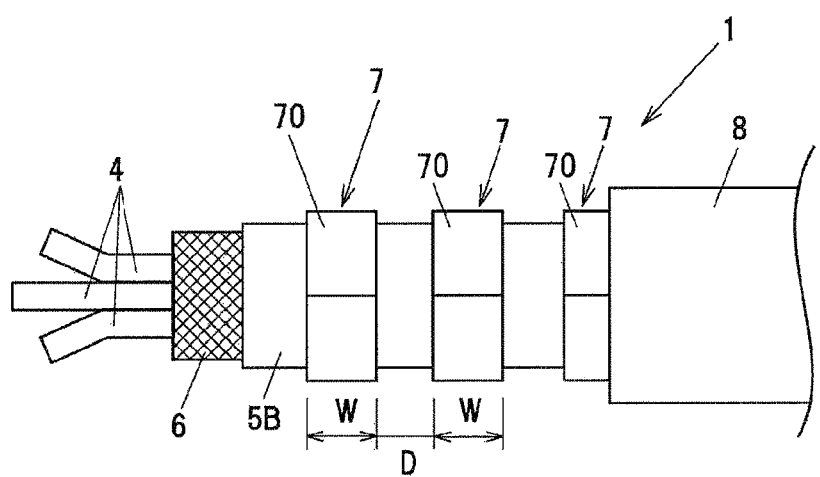
FIG. 1 is a schematic front view showing a configuration of a noise suppression cable in an embodiment of the present invention.

An embodiment of the invention will be described below in reference to the drawings. Constituent elements having substantially the same functions are denoted by the same reference numerals in each drawing and the overlapping explanation thereof will be omitted.

[Embodiment]

Figure 2:
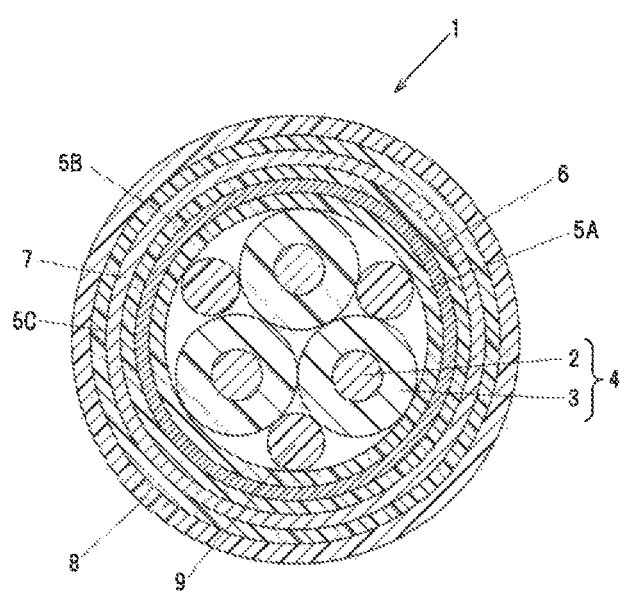
FIG. 2 is a cross sectional view showing the noise suppression cable shown in FIG. 1.

FIG. 1 is a schematic front view showing a configuration of a noise suppression cable in an embodiment of the invention. FIG. 2 is a cross sectional view showing the noise suppression cable shown in FIG. 1. In FIG. 1, illustration of fillers 9 is omitted.

A noise suppression cable 1 is provided with plural insulated electric wires 4 (three in the present embodiment) each formed by covering an outer periphery of a conductor wire 2 with an insulator 3, a resin tape layer 5A formed by wrapping a resin tape around the plural insulated electric wires 4 with fillers 9 interposed therebetween, a shield layer 6 provided around the resin tape layer 5A, a resin tape layer 5B provided around the shield layer 6, plural magnetic tape layers 7 having a predetermined width W and formed around the resin tape layer 5B at a predetermined distance D along a cable longitudinal direction, a resin tape layer 5C provided around the plural magnetic tape layers 7 and the resin tape layer 5B, and a sheath 8 as an insulating protective layer formed of a resin, etc.

The insulated electric wire 4 transmits power or a signal at a frequency of, e.g., 100 kHz to 1 MHz. Although plural insulated electric wires 4 are provided in the present embodiment, the number of the insulated electric wires 4 may be one. The insulated electric wire 4 may alternatively be a twisted pair wire which transmits differential signals.

The resin tape layer 5A is formed by wrapping a resin tape around the plural insulated electric wires 4 with the fillers 9 interposed therebetween throughout the cable longitudinal direction. The resin tape layer 5B is formed by wrapping a resin tape around the shield layer 6 throughout the cable longitudinal direction. The resin tape layer 5C is formed by wrapping a resin tape around the resin tape layer 5B and the magnetic tape layers 7 throughout the cable longitudinal direction. Tapes made of, e.g., a resin such as polyethylene terephthalate (PET) or polypropylene-based resin can be used as the resin tapes constituting the resin tape layers 5A to 5C.

The shield layer 6 is formed by, e.g., braiding conductive wires and is connected to a ground. Alternatively, the shield layer 6 may be formed by wrapping a tape with a conductor attached thereto.

(Configuration of Magnetic Tape Layer 7)

The magnetic tape layer 7 is formed by transversely wrapping a magnetic tape 70 having the width W around the resin tape layer 5B several times. The magnetic tape layer 7 is formed of two layers of the magnetic tapes 70 in the present embodiment, but may be formed of a single or three or more layers of the magnetic tapes 70. The width W is preferably, e.g., 5 to 50 mm. The distance D between the magnetic tape layers 7 is preferably, e.g., 5 to 50 mm. The magnetic tape 70 is composed of, e.g., plural magnetic bodies extending in a direction orthogonal to the width direction (in a wrapping direction) and joint sheets joining the plural magnetic bodies. Alternatively, the magnetic tape may be formed of a single magnetic body. The magnetic body is cut out from a rolled material in such a manner that the width direction of the magnetic tape 70 coincides with the rolled direction, and magnetic permeability in the direction orthogonal to the width direction is higher than magnetic permeability in the width direction. In other words, the magnetic body has different magnetic properties (induced magnetic anisotropies) between the width direction and a direction orthogonal to the width direction.

The magnetic body constituting the magnetic tape 70 is preferably a soft magnetic material having low magnetic coercivity and high magnetic permeability to reduce electromagnetic wave noise. The soft magnetic material used can be, e.g., an amorphous alloy such as Co-based amorphous alloy or Fe-based amorphous alloy, a ferrite such as Mn—Zn ferrite, Ni—Zn ferrite or Ni—Zn—Cu ferrite, or a soft magnetic metal such as Fe—Ni alloy (permalloy), Fe—Si—Al alloy (sendust) or Fe—Si alloy (silicon steel), etc. The detailed configuration of the magnetic tape 70 will be described later.

(Method of Forming Magnetic Tape Layer 7)

FIGS. 3A to 3D are explanatory diagrams illustrating an example of a method of forming the magnetic tape layer 7.

Firstly, two first rolled materials 71, which have a relatively wide band shape and are long along a rolled direction 10, and two second rolled materials 72, which have a relatively narrow band shape and are long along a rolled direction 10, are prepared. The first rolled material 71 is a magnetic body of, e.g., 10 to 25 μm in thickness and 30 mm in width, and the second rolled material 72 is a magnetic body of, e.g., 10 to 25 μm in thickness and 10 mm in width.

Next, as shown in FIGS. 3B1 and 3B2, the first and second rolled materials 71 and 72 are arranged with an overlap of about 5 mm and joined by joint tapes 73 to form a magnetic sheet 74 as a rolled material. The joint tape 73 can be, e.g., a Teflon adhesive tape (Teflon is a registered trademark) having a thickness of about 10 to 25 μm. Next, the magnetic sheet 74 is cut along cutting lines 11 into the magnetic tapes 70 shown in FIG. 3C which have a predetermined width W and a predetermined length L. The length L of the magnetic tape 70 is substantially the same as the circumferential length of the resin tape layer 5B.

Next, as shown in FIGS. 3C and 3D, plural sets of two stacked magnetic tapes 70 are transversely wrapped around the resin tape layer 5B. The magnetic tape layers 7 each composed of two magnetic tapes 70 are thereby formed.

(Effects Obtained by Forming Magnetic Tape 70 to have Width Direction Along Rolled Direction)

FIGS. 4A and 4B are explanatory diagrams respectively illustrating methods of making a test piece-A and a test piece-B which are used to test for induced magnetic anisotropy of rolled materials. To form a test piece-A 12a, a rolled material 12 having a width of 20 mm is cut along the cutting lines 11 into a 20 mm square piece. To form a test piece-B 13a, a rolled material 13 having a width of 30 mm is cut along the cutting lines 11 into a 20 mm square piece.

FIG. 5A is an explanatory diagram illustrating a system for measuring inductance of a coil in which the test pieces-A and -B are placed so that the rolled direction of the pieces-A and -B coincides with a magnetic field direction of the coil. FIG. 5B is an explanatory diagram illustrating a system for measuring inductance of a coil in which the test pieces-A and -B are placed so that the rolled direction of the pieces-A and -B is orthogonal to the magnetic field direction of the coil. The measuring systems have a coil 14 of 5 mm depth by 50 mm width by 100 mm length. FIG. 5A shows a measuring system a and FIG. 5B shows a measuring system b. The measuring system a is a system for measuring inductance of the coil 14 when the test piece-A 12a and the test piece-B 13a are placed inside the coil 14 so that the rolled direction 10 coincides with a magnetic field direction 14a, as shown in FIG. 5A. The measuring system b is a system for measuring inductance of the coil 14 when the test piece-A 12a and the test piece-B 13a are placed inside the coil 14 so that the rolled direction 10 is orthogonal to the magnetic field direction 14a, as shown in FIG. 5B.

Figure 6:
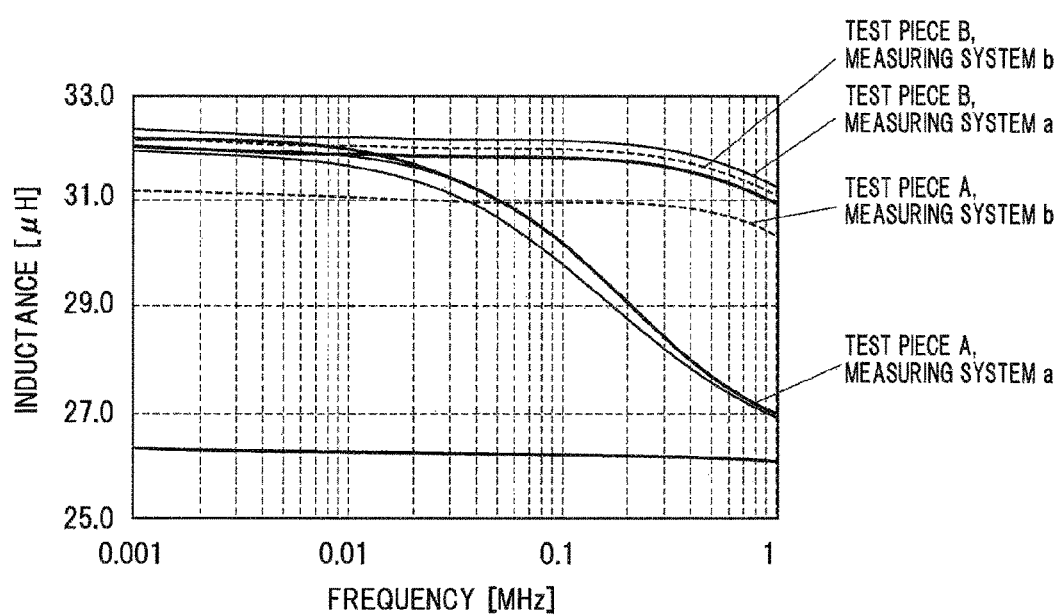
FIG. 6 is a graph showing the measurement results from the coil inductance measuring systems shown in FIGS. 5A and 5B.

FIG. 6 is a graph showing the measurement results from the coil inductance measuring systems shown in FIGS. 5A and 5B.

The test piece-A 12a or the test piece-B 13a was placed in the coil 14 and inductance of the coil 14 was measured. As a result, with the test piece-B 13a, there is substantially no difference in inductance of the coil 14 between when measured by the measuring system a and when measured by the measuring system b, which shows that the test piece-B 13a does not have induced magnetic anisotropy. On the other hand, with the test piece-A 12a, inductance of the coil 14 measured by the measuring system a is significantly smaller than inductance of the coil 14 measured by the measuring system b in a frequency range of not less than 100 kHz. This shows that the test piece-A 12a has induced magnetic anisotropy.

Figure 7:
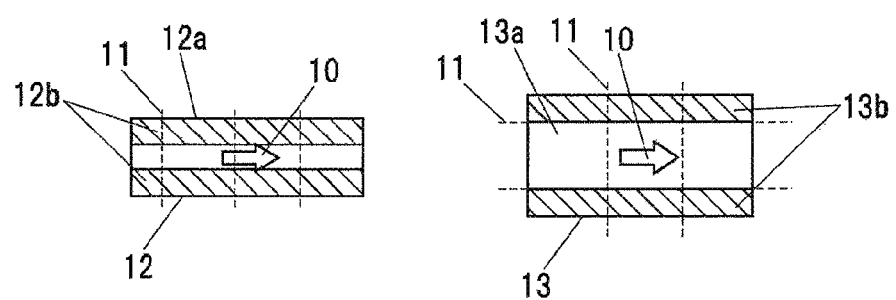
FIG. 7 is an explanatory diagram to explain a difference in induced magnetic anisotropy between the test piece-A and the test piece-B.

FIG. 7 is an explanatory diagram to explain a difference in induced magnetic anisotropy between the test piece-A 12a and the test piece-B 13a. In widthwise edge regions (shaded regions) 12b and 13b of the rolled materials 12 and 13, internal stress generated by rolling is present along the rolled direction 10 and it is considered that magnetic permeability of the edge regions 12b and 13b is low. The edge region 13b of the rolled material 13 is cut off during the slitting process and it is considered that the test piece-B 13a therefore has little or no induced magnetic anisotropy. On the other hand, the edge region 12b of the rolled material 12 remains without being cut off during the slitting process and it is considered that the test piece-A 12a therefore has induced magnetic anisotropy.

(Functions and Effects of the Embodiment)

The following functions and effects are obtained in the present embodiment.

(1) By cutting out the magnetic tapes 70 from the magnetic sheet 74 as a rolled material so that the width direction of the magnetic tapes 70 coincides with the rolled direction, inductance is increased as compared to when the width direction of the magnetic tape coincides with the direction orthogonal to the rolled direction. This allows a desired electromagnetic wave noise suppression effect to be obtained.

(2) Since the magnetic tape layers 7 having a predetermined width are provided at a predetermined distance in the cable longitudinal direction, excellent flexibility is obtained as compared to when providing a magnetic tape layer throughout the cable longitudinal direction.

(3) Since plural magnetic bodies are joined by the joint tapes 73 to provide a required length corresponding to cable diameter, it is adaptable to various cable diameters without increasing the types of the rolled materials 71 and 72.

(4) Since a ferrite core is not used, an appearance is excellent, problems during handling such as cracks on the ferrite core do not arise, and it is possible to suppress electromagnetic wave noise emission without increasing the outer diameter of the cable.

EXAMPLE

FIGS. 8A to 8D are explanatory diagrams respectively illustrating Samples S1 to S3 in Comparative Examples 1 to 3 and Sample S4 in Example of the invention. Samples S1 to S4 were formed using a Co-based amorphous alloy as a magnetic body and had a cable length of 1500 mm.

Comparative Example 1

Figure 8A:
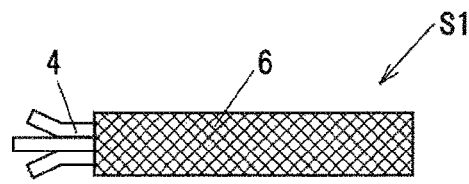
FIG. 8A is an explanatory diagram illustrating Sample S1 in Comparative Example 1.

Sample S1 in Comparative Example 1 shown in FIG. 8A is configured based on the noise suppression cable 1 shown in FIG. 2, but the magnetic tape layers 7, the resin tape layer 5C and the sheath 8 are not provided around the shield layer 6.

Comparative Example 2

Figure 8B:
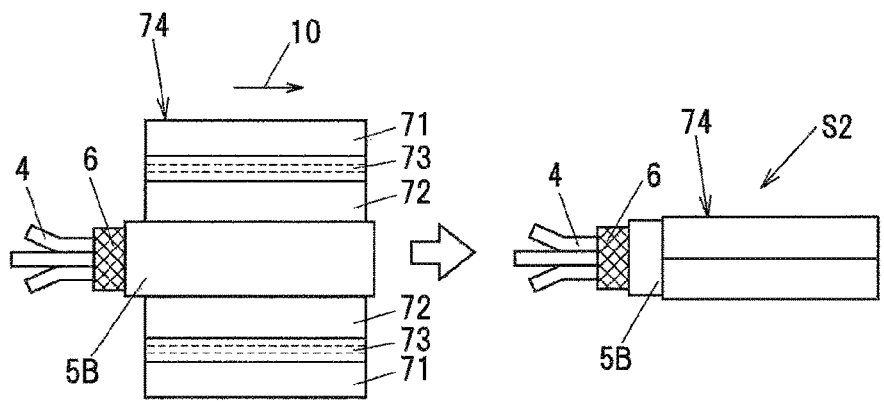
FIG. 8B is an explanatory diagram illustrating Sample S2 in Comparative Example 2.

Sample S2 in Comparative Example 2 shown in FIG. 8B is configured that the magnetic sheet 74 shown in FIG. 3B which is not cut to the width W is longitudinally wrapped around the resin tape layer 5B. In Sample S2, a length in the cable longitudinal direction was 80 mm and a length in the wrapping direction was 65 mm.

Comparative Example 3

Figure 8C:
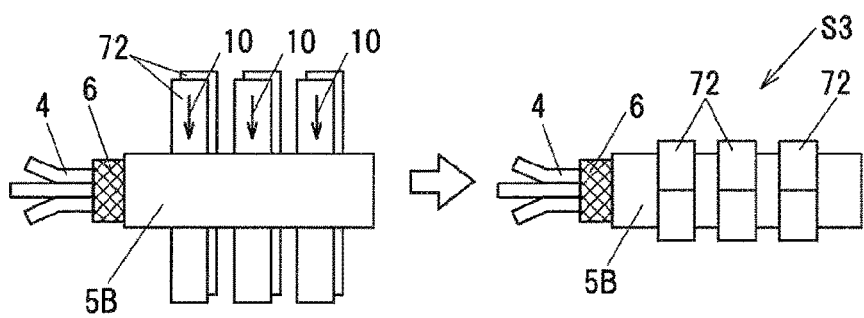
FIG. 8C is an explanatory diagram illustrating Sample S3 in Comparative Example 3.

Sample S3 in Comparative Example 3 shown in FIG. 8C is configured that second rolled materials 72 of 10 mm width and 80 mm in length, which are cut out so that the width direction is orthogonal to the rolled direction 10, are stacked in pairs and transversely wrapped around the resin tape layer 5B at 10 mm intervals. In Sample S2 in Comparative Example 2, two first rolled materials 71 of 30 mm in width and two second rolled materials 72 of 10 mm in width are used and the total of the lengths in the wrapping direction is 80 mm. Therefore, Sample S3 is formed using the second rolled materials 72 having a length of 80 mm in the wrapping direction so as to be consistent with the total of the lengths in the wrapping direction in Sample S2.

Figure 8D:
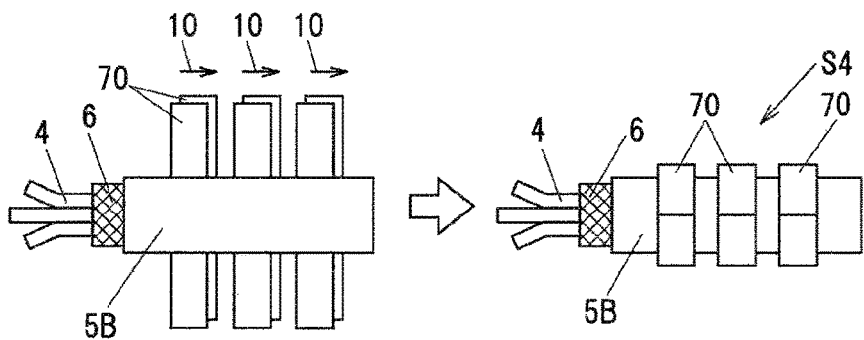
FIG. 8D is an explanatory diagram illustrating Sample S4 in Example of the invention.

Sample S4 in Example shown in FIG. 8D corresponds to the present embodiment and is configured that the magnetic tapes 70 of 10 mm in width and 80 mm in length, which are cut out so that the width direction coincides with the rolled direction 10, are stacked in pairs and transversely wrapped around the resin tape layer 5B at 10 mm intervals.

Figure 9:
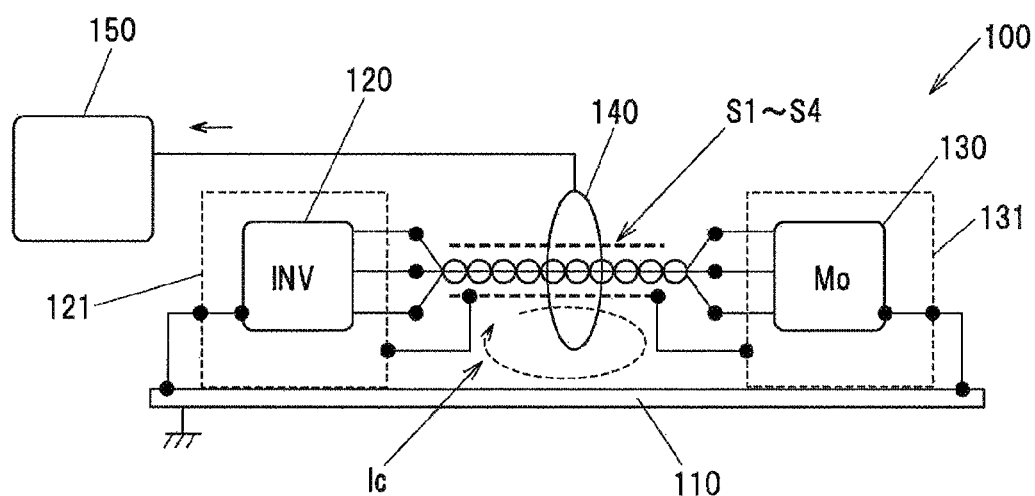
FIG. 9 is an explanatory diagram illustrating a common-mode noise measuring device.

FIG. 9 is an explanatory diagram illustrating a common-mode noise measuring device. In a measuring device 100, an inverter 120 covered with a shield box 121 and a motor 130 covered with a shield box 131 were placed on an aluminum base plate 110, and Samples S1 to S4 shown in FIG. 8 were connected between the inverter 120 and the motor 130. Then, common-mode current Ic (common-mode noise) was detected by a current transformer (CT) 140 and analyzed by a frequency analyzer 150.

Figure 10A:
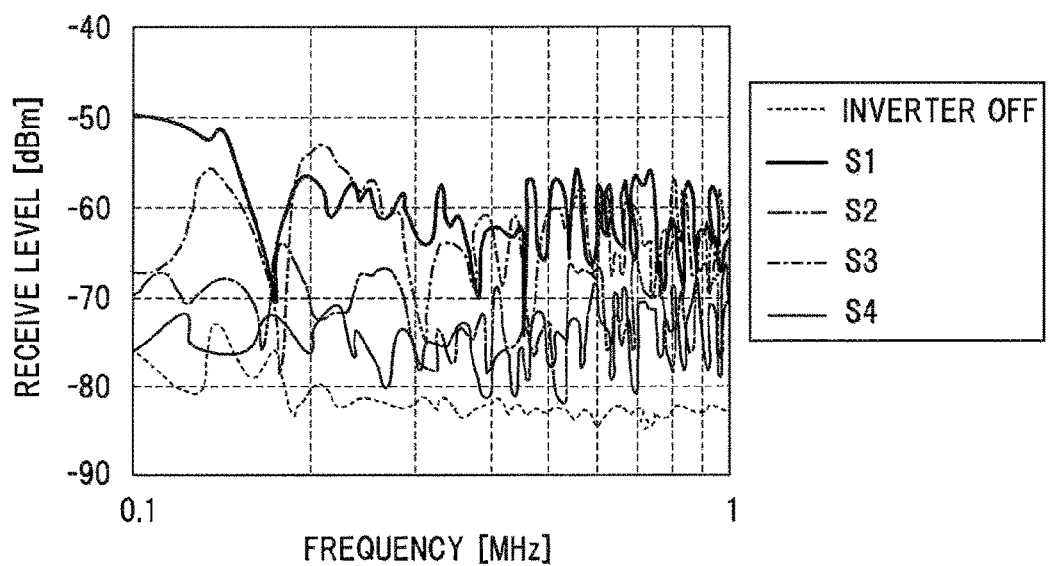
FIG. 10A is a graph showing the results of a receive level of common-mode current Ic measured by the measuring device in FIG. 9.
Figure 10B:
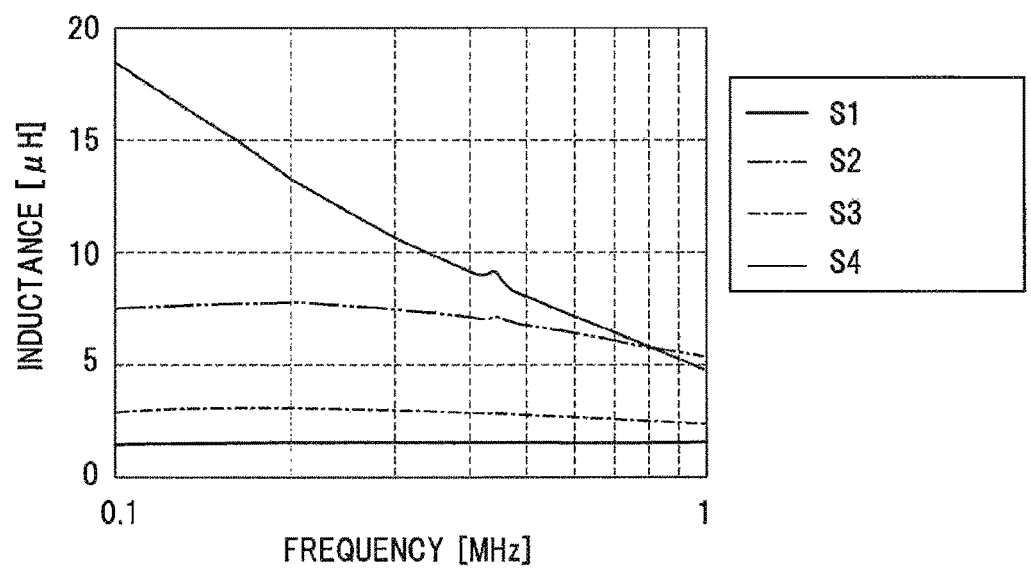
FIG. 10B is a graph showing the inductance measurement results of Samples S1 to S4.

FIG. 10 are graphs showing the results of measuring common-mode noise by the measuring device 100 shown in FIG. 9. FIG. 10A is a graph showing the results of a receive level of common-mode current Ic measured by the measuring device 100 in FIG. 9, and FIG. 10B is a graph showing the inductance measurement results of Samples S1 to S4.

It is understood from FIG. 10A that the common-mode current Ic of the Sample S4 in Example is the smallest across frequency from 100 Hz to 1 MHz. Meanwhile, it is understood from FIG. 10B that inductance of Sample S4 in Example is higher than inductance of other Samples S1 to S3 in Comparative Examples across frequency from 100 Hz to 700 Hz. That is, this shows that Sample S4 in Example, in which the magnetic tapes 70 are formed so that the width direction coincides with the rolled direction and such magnetic tapes 70 are provided around the insulated electric wires 4 at a predetermined distance, has a higher electromagnetic wave noise suppression effect than other Samples S1 to S3 in Comparative Examples.

The embodiment of the invention is not limited to that described above and various embodiments can be implemented. For example, although plural magnetic tape layers 7 are provided in the present embodiment, the number of the magnetic tape layers 7 may be one. The one magnetic tape layer 7 may have a width of 5 to 50 mm or may be continuously formed throughout the longitudinal direction. In addition, the magnetic tape 70 is formed by joining plural magnetic bodies in the present embodiment but may be formed of a single magnetic body. In addition, the outer conductor may be a smooth metal pipe such as copper pipe. Frequency characteristics for suppressing electromagnetic wave noise may be different for each of the magnetic tape layers.

In addition, some of the constituent elements in the embodiment can be omitted or changed without changing the gist of the invention. For example, the inclusion 9 may be omitted as long as no problem arises when wrapping a resin tape around the plural insulated electric wires 4.

INDUSTRIAL APPLICABILITY

The invention is applicable to a noise suppression cable in which a magnetic tape is used instead of ferrite core to suppress electromagnetic wave noise.

REFERENCE SIGNS LIST

1: NOISE SUPPRESSION CABLE
2: CONDUCTOR WIRE
3: INSULATOR
4: INSULATED ELECTRIC WIRE
7: MAGNETIC TAPE LAYER
10: ROLLED DIRECTION
11: CUTTING LINE
12, 13: ROLLED MATERIAL
70: MAGNETIC TAPE
71: FIRST ROLLED MATERIAL
72: SECOND ROLLED MATERIAL
73: JOINT TAPE
74: MAGNETIC SHEET

The invention claimed is:

1. A noise suppression cable, comprising:
    an insulated electric wire comprising an insulator that covers an outer periphery of a conductor wire; and
    a magnetic tape layer formed by transversely winding a magnetic tape on an outer periphery of the insulated electric wire,
    wherein a magnetic body constituting the magnetic tape is cut out from a rolled material consisting essentially of a soft magnetic metal in such a manner that a width direction of the magnetic tape corresponds to a rolled direction, and the magnetic body has a magnetic property that is different between the width direction and an orthogonal direction to the width direction, and
    wherein the rolled direction of the rolled material constituting the magnetic body corresponds to a longitudinal direction of the insulated electric wire.

2. The noise suppression cable according to claim 1, wherein the magnetic body has the magnetic property that a magnetic permeability in the orthogonal direction to the width direction is greater than a magnetic permeability in the width direction, and
    wherein an internal stress generated by rolling is present along the rolled direction in widthwise edge regions of the rolled material.

3. The noise suppression cable according to claim 1, wherein the magnetic tape layer comprises a plurality of magnetic tape layers that are formed at predetermined intervals along a cable longitudinal direction.

4. The noise suppression cable according to claim 1, wherein the magnetic tape comprises a single magnetic body or a plurality of magnetic bodies that are joined in the orthogonal direction to the width direction.

5. The noise suppression cable according to claim 1, wherein the magnetic tape layer is formed by transversely winding the magnetic tape multiple times.

6. The noise suppression cable according to claim 1, further comprising:
    a resin tape layer formed around the insulated electric wire; and
    a shield layer provided around the resin tape layer,
    wherein the magnetic tape layer is provided around the resin tape layer.

7. The noise suppression cable according to claim 6, wherein the resin tape layer comprises polyethylene terephthalate (PET) or a polypropylene-based resin.

8. The noise suppression cable according to claim 6, wherein the shield layer comprises braided conductive wires.

9. The noise suppression cable according to claim 6, wherein the shield layer comprises a tape with a conductor; and
    wherein the shield layer comprises a metal pipe.

10. The noise suppression cable according to claim 6, wherein the magnetic tape comprises a plurality of magnetic bodies that are joined in the orthogonal direction to the width direction of the magnetic tape and a direction parallel to a thickness direction of the magnetic tape.

11. The noise suppression cable according to claim 1, further comprising:
    a resin tape layer formed around the magnetic tape layer; and
    a sheath provided around the resin tape layer.

12. The noise suppression cable according to claim 1, wherein the magnetic tape layer comprises a single layer or two or more layers.

13. The noise suppression cable according to claim 1, wherein the magnetic tape layer comprises a first rolled material and a second rolled material arranged with an overlap and joined by a joint tape.

14. The noise suppression cable according to claim 1, wherein the magnetic tape layer comprises two or more layers and frequency characteristics for suppressing electromagnetic wave noise are configured to be different for each of the magnetic tape layers.

15. The noise suppression cable according to claim 1, wherein the soft magnetic metal comprises one of a Fe—Ni alloy, a Fe—Si—Al alloy, and a Fe—Si alloy.

16. The noise suppression cable according to claim 1, wherein the magnetic tape layer comprises a single layer.

17. The noise suppression cable according to claim 1, further comprising:
    a first resin tape layer disposed on an outer surface of the insulated electric wire,
    wherein the first resin tape layer comprises polyethylene terephthalate (PET) or a polypropylene-based resin.

18. The noise suppression cable according to claim 17, further comprising:
    a shield layer disposed on an outer surface of the first resin tape layer,
    wherein the shield layer comprises a conductive material.

19. The noise suppression cable according to claim 18, further comprising:
    a second resin tape layer disposed on an outer surface of the shield layer and on an inner surface of the magnetic tape layer, wherein the second resin tape layer comprises the polyethylene terephthalate (PET) or the polypropylene-based resin.

20. The noise suppression cable according to claim 19, further comprising:
a third resin tape layer disposed on an outer surface of the magnetic tape layer,
wherein the third resin tape layer comprises the polyethylene terephthalate (PET) or the polypropylene-based resin.

* * * * *